United States Patent
Kim

(10) Patent No.: US 7,042,794 B2
(45) Date of Patent: May 9, 2006

(54) ADDRESS INPUT BUFFER OF DIFFERENTIAL AMPLIFICATION TYPE IN SEMICONDUCTOR MEMORY DEVICE

(75) Inventor: Taek-Seung Kim, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 113 days.

(21) Appl. No.: 10/770,641

(22) Filed: Feb. 2, 2004

(65) Prior Publication Data

US 2005/0117402 A1 Jun. 2, 2005

(30) Foreign Application Priority Data

Dec. 1, 2003 (KR) ............... 2003-86257

(51) Int. Cl.
*G11C 8/00* (2006.01)

(52) U.S. Cl. ............ 365/230.06; 365/365; 365/189.05; 365/189.09; 365/191

(58) Field of Classification Search .......... 365/189.05, 365/230.06, 230.03, 230.08, 189.09, 191; 710/58
See application file for complete search history.

(56) References Cited

U.S. PATENT DOCUMENTS 6,192,429 B1 * 2/2001 Jeong et al. ................ 710/58
6,636,443 B1 * 10/2003 Kang .................... 365/189.05

* cited by examiner

*Primary Examiner*—Richard Elms
*Assistant Examiner*—Pho M. Luu
(74) *Attorney, Agent, or Firm*—Blakely Sokoloff Taylor & Zafman

(57) ABSTRACT

An address input buffer in a semiconductor memory device. The address buffer has a differential amplifying device for differentially amplifying a reference voltage and an external address signal, and a controlling device for generating a bias control signal by receiving a refresh signal and a bank active signal to control the differential amplifying device. Activation of the bias control signal depends on the bank active signal when the refresh signal is abnormally activated in an initialization process.

11 Claims, 2 Drawing Sheets

US 7,042,794 B2

ADDRESS INPUT BUFFER OF DIFFERENTIAL AMPLIFICATION TYPE IN SEMICONDUCTOR MEMORY DEVICE

FIELD OF THE INVENTION

The present invention relates to a semiconductor memory device; and, more particularly, to an address input buffer of a differential amplification type in the semiconductor memory.

DESCRIPTION OF RELATED ART

Generally, a semiconductor device is fabricated by using a semiconductor technology including a silicon wafer processing technology and a logic design technology. A final product of a semiconductor fabricating process is a chip of a plastic package type. Each chip has different logic and functions according to an object thereof. Most of chips have a printed circuit board which is an important element for configuring a system of the semiconductor chip, and an appropriate driving voltage is supplied to drive the semiconductor chip.

The semiconductor device including a semiconductor memory device is operated by input/output of a plurality of signals each having specific usages. An operation of the semiconductor device is determined by logically combining input signals and a result from the semiconductor device is outputted according to behaviors of output signals. Also, an output signal of a certain semiconductor device may be used as an input signal of another semiconductor device in the same system.

An input buffer is to receive and buffer a signal applied from an external circuit and output the buffered signal to an internal circuit. There is a static input buffer as the simplest type. The static buffer is configured with an inverter type connecting a PMOS transistor and an NMOS transistor between a power supply voltage and a ground voltage in series. There is a merit that the configuration of the static input buffer is simple. However, since a tolerance for a noise is weak, an input signal having a large voltage difference between a logic high level and a logic low level is required. Therefore, the static input buffer is not eligible for a semiconductor device demanding a small width or a high operation frequency of an input signal.

In order to solve the above problem, an input buffer of a differential amplification type has been introduced. The input buffer of the differential amplification type is called as a dynamic input buffer to be distinguished from the static input buffer.

FIG. 1 is a circuit diagram illustrating a conventional address input buffer of a differential amplification type.

As shown, the conventional address input buffer of the differential amplification type includes a differential amplifying unit for comparing a voltage level of a reference voltage VREF with that of an external address signal AIN, and an inverter I1 as an internal buffer.

The differential amplifying unit includes an input NMOS transistor M13 whose gate receives the reference voltage VREF, an input NMOS transistor M12 whose gate receives the address signal AIN, load PMOS transistors M14 and M15 forming a current mirror by being connected between a power supply voltage VDD and the input NMOS transistors M12 and M13, a bias NMOS transistor M11 whose gate receives a power down signal pwdn inverted through an inverter I2, wherein the bias NMOS transistor M11 is connected between a ground voltage VSS and the input transistors M12 and M13 in common, and PMOS transistors M16 and M17 whose gates receive the inverted power down signal, wherein the PMOS transistors M16 and M17 are connected between the input transistors M12 and M13, respectively, and connected with the load transistor M14 and M15 in parallel.

When the address signal AIN is inputted, an amplification operation for amplifying a voltage difference between the address signal AIN and the reference voltage VREF is carried out. The reference voltage VREF is a constant voltage (Typically, VDD/2) and the reference voltage VREF may be supplied from an external circuit or generated in an internal circuit.

A constant current i1 flows in the input NMOS transistor M13 receiving the reference voltage VREF. Also, a current i2, which is determined by a potential level of the input address signal AIN, flows in the input transistor M12 symmetrically configured with the input NMOS transistor M13. Ultimately, the differential amplifying unit determines a potential level of an output node A by comparing the currents i1 and i2.

In case that the power down signal pwdn is inactivated in a logic low level, the bias NMOS transistor M11 is turned on and the PMOS transistors M16 and M17 are turned off, so that the address input buffer normally operated.

If the semiconductor chip becomes a power down mode, the power down signal pwdn is activated in a logic high level. Therefore, the bias NMOS transistor M11 is turned off to thereby disable the differential amplifying unit. Also, the PMOS transistors M16 and M17 are turned on, so that the output node A and an output terminal BAIN are precharged with a logic high level and a logic low level, respectively. Accordingly, even if a logic level of the external address signal AIN is varied, a current path from the output node A to the ground voltage VSS is not formed.

Since a DRAM has a characteristic that information stored in a cell is disappeared as time is passes different from a SRAM or a flash memory, a refresh operation for writing again the information in the cell per a predetermined period is required. The refresh operation is carried out by activating a word line by at least one time during retention time of each cell to thereby sense the cell and amplify the information. The retention time is a time capable of maintaining the information of the cell without the refresh operation.

The refresh operation is classified to an auto refresh mode and a self refresh mode. In the auto refresh mode, the refresh operation is carried out for corresponding cell by that a command is periodically activated through an external input pin to thereby internally generate an address signal in a normal operation. In the self refresh mode, the refresh operation is carried out by internally generating a command after inactivating a clock enable signal not in the normal mode. The auto refresh mode and the self refresh mode are carried out by receiving the command and generating the address signal from an internal counter. The address signal is sequentially increased whenever the command is inputted.

The conventional address input buffer of the differential amplification type can prevent unnecessary current consumption in the power down mode by controlling the address input buffer by using the power down signal pwdn. Accordingly, since the address input buffer is disabled in the self refresh mode performed in the power down mode, the current consumption can be decreased. In a reference, U.S. Pat. No. 5,619,457, entitled "Dynamic semiconductor memory device that can control through current of input buffer circuit for external input/output control signal," discloses an input buffer that is turned off at a standby mode and the self refresh mode.

The conventional address input buffer can minimize the current consumption for the standby mode and the self refresh mode. However, there is a problem that the unnecessary current consumption is caused for the auto refresh mode according to variation of the input address signal.

A row address path includes an address selection unit for determining whether the external address or the internal address that is a refresh counter address is used, and an address latch circuit for latching an output signal of the address selection unit. The address selection unit is controlled by the refresh signal. The refresh signal is activated in a logic high level when one of the auto refresh signal and the self refresh signal outputted from a command decoder is activated.

Only when an initialization process of the latch circuit is normally completed, an output signal having normal level and waveform is outputted. Generally, a stabilization period is required in a synchronous DRAM by applying an external power to be logic high level, and then a code input for setting operation modes, which is a mode register (MRS or EMRS) setup process through address pins, and the initialization process are carried out.

However, if the address input buffer is controlled by the auto refresh signal or the self refresh signal, the auto refresh signal or the self refresh signal may be activated in a logic high level before internal nodes of the latch circuit is completely initialized. At this case, since the address input buffer is disabled by the auto refresh signal or the self refresh signal, an external address input required in the code input for setting the operation modes is not performed, so that an erroneous operation is caused.

SUMMARY OF THE INVENTION

It is, therefore, an object of the present invention to provide an address input buffer of a differential amplification type in a semiconductor memory device capable of preventing an erroneous operation and minimizing unnecessary current consumption.

In accordance with an aspect of the present invention, there is provided an address input buffer in a semiconductor memory device, including: a differential amplifying unit for differentially amplifying a reference voltage and an external address signal; and a controlling unit for controlling the differential amplifying means by receiving a refresh signal and a bank active signal.

In accordance with another aspect of the present invention, there is provided an address buffer in a semiconductor memory device, including: a differential input unit receiving a reference voltage and an address signal; a current mirroring unit connected between the differential input unit and a first voltage; a biasing unit, which is connected between the differential input unit and a second voltage, for supplying bias current to the differential input unit and the current mirroring unit; and a controlling unit for enabling/disabling the biasing unit by receiving a refresh signal and a bank active signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, an address input buffer of a differential amplification type in a semiconductor memory device capable of reducing current consumption according to the present invention will be described in detail referring to the accompanying drawings.

Figure 2:
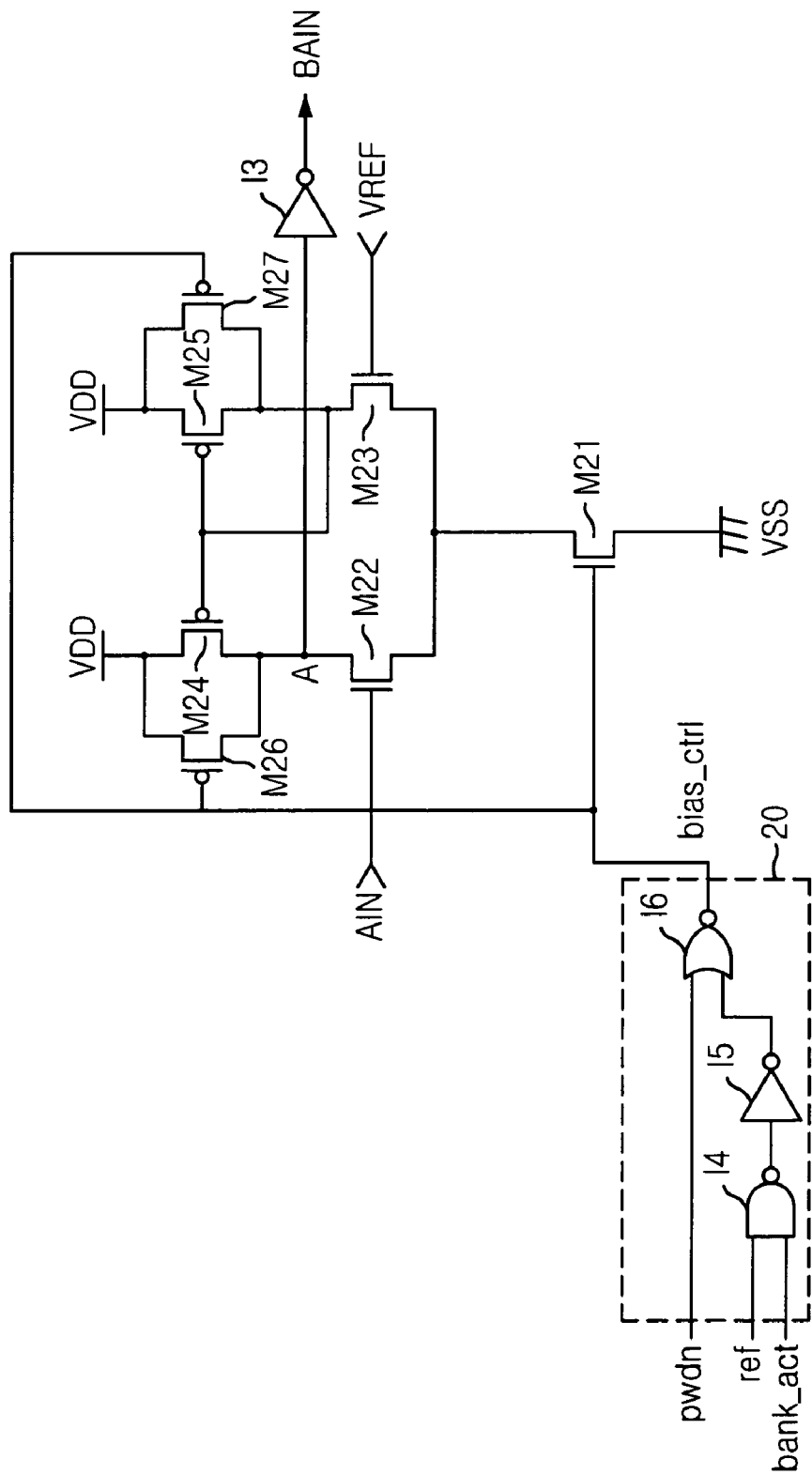
FIG. 2 is a circuit diagram illustrating an address input buffer of the differential amplification type in accordance with the present invention.

FIG. 2 is a circuit diagram illustrating an address input buffer of the differential amplification type in accordance with the present invention.

As shown, the address input buffer includes a differential input unit receiving a reference voltage VREF and an address signal AIN, a current mirroring unit connected between the differential input unit and a power supply voltage VDD, a biasing unit, which is connected between the differential input unit and a ground voltage VSS, for providing bias current to the differential input unit and the current mirroring unit, and a controlling unit 20 for enabling/disabling the biasing unit in response to a power down signal pwdn, a refresh signal ref, and a bank active signal bank_act.

The differential address input unit includes a first input NMOS transistor M23 whose gate receives the reference voltage VREF and a second input NMOS transistor M22 whose gate receives the input address signal AIN. Also, the current mirroring unit includes load PMOS transistors M24 and M25, which are connected between the power supply voltage VDD and the input NMOS transistors M22 and M23, forming a current mirror circuit. The biasing unit includes a bias NMOS transistor M21 whose gate receives an output signal bias_ctrl. The bias NMOS transistor M21 is commonly connected between the ground voltage VSS and the input transistors M22 and M23.

The controlling unit 20 includes a NAND gate I4 receiving the refresh signal ref and the bank active signal bank_act, an inverter I5 receiving an output signal of the NAND gate I4, and a NOR gate I6 receiving an output signal of the inverter I5 and the power down signal pwdn and outputting the bias control signal bias_ctrl.

Also, the address input unit further includes PMOS transistors whose gates receive the bias control signal bias_ctrl, and which are connected between the power supply voltage VDD and the input NMOS transistors M22 and M23 in parallel with the PMOS transistors M24 and M25, respectively, and an inverter I3 receiving a signal of an output node A.

Figure 1:
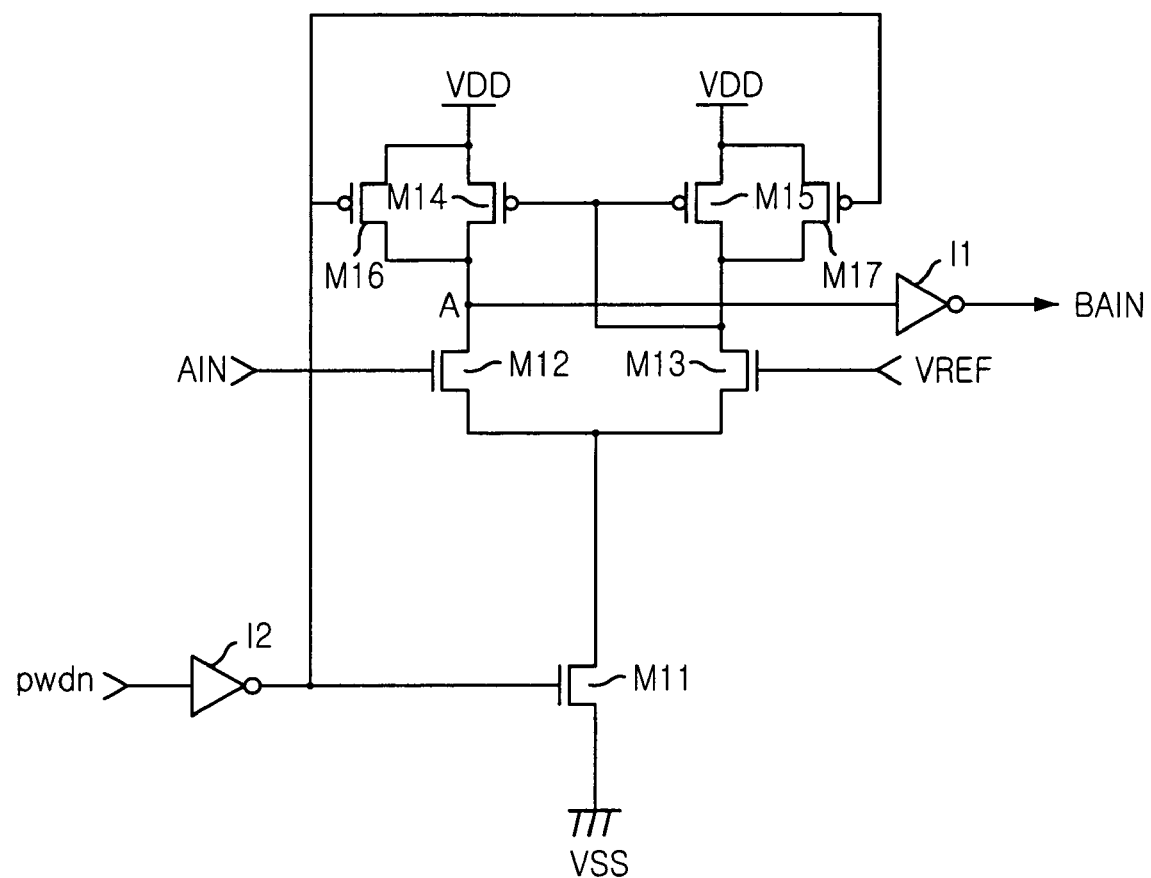
FIG. 1 is a circuit diagram illustrating a conventional address input buffer of a differential amplification type.

As described in above, the address input buffer in accordance with the present invention is similar to the conventional address input buffer illustrated in FIG. 1. However, a difference is that the bias control signal bias_ctrl outputted from the controlling unit 20 as an input signal of the bias NMOS transistor M21 instead of the inverted power down signal pwdn.

The power down signal pwdn is activated in a logic high level when a chip enters a power down mode. Accordingly, the power down signal pwdn is activated in a logic high level in the self refresh mode which is performed at the power down mode. The refresh signal ref is activated in the self refresh mode and the auto refresh mode, and the bank active signal bank_ctrl represents a period which a bank is activated in response to a row active command and maintains a logic high level in the refresh mode.

Table 1 is a logic table showing an operation of the address input buffer of FIG. 2.

TABLE 1

|  | A | B | C | D |
|---|---|---|---|---|
| pwnd | H | L | L | L |
| ref | X | H | L | H |
| bank_act | X | H | H | L |
| bias_ctrl | L | L | H | H |
| Buffer status | disabled | | enabled | |

Referring to Table 1, in an 'A' case, that is, when the power down signal pwdn is activated in a logic high level, the bias control signal bias_ctrl outputted from the controlling unit 20 is inactivated in a logic low level regardless of the refresh signal ref and the bank active signal bank_act to thereby turn off the bias NMOS transistor M21, so that the address input buffer is disabled. Also, since the PMOS transistors M26 and M27 are turned on, the output node A and the output terminal of the address input buffer are precharged to a logic high level and a logic low level respectively, so that a current path is not formed even if the external address signal is varied. Namely, when the chip enters the power down mode, the address input buffer is disabled. Accordingly, it means that the address input buffer is disabled even in the self refresh mode.

Next, when the power down signal pwdn is inactivated in a logic low level and the refresh signal ref and the bank active signal bank_act are activated in a high level as shown in a 'B' case in Table 1, since the bias control signal bias_ctrl is inactivated in a logic low level, the bias NMOS transistor M21 is turned off so that the address input buffer is disabled. Also, at this case, the PMOS transistors M26 and M27 are turned on to thereby precharge the output node A and the output terminal in a logic high level and a logic low level, respectively. The auto refresh mode corresponds to this case and, since the address input buffer is disabled in the auto refresh mode, an unnecessary current consumption can be prevented.

When the power down signal pwdn is inactivated in a logic low level and the refresh signal ref and the bank active signal bank_act become a logic low level and a logic high level, respectively, as a 'C' case, the bias control signal bias_ctrl is activated in a logic high level, so that the bias NMOS transistor M21 is turned on to thereby enable the address input buffer and the PMOS transistors M26 and M27 are turned off. Read and write operations correspond to the 'C' case.

The refresh signal ref used in the address input buffer is generated by latching an external command with an internal clock signal. Only when an initialization process of a latch circuit is normally completed, an output signal having normal level and waveform is outputted. Generally, a stabilization period is required in a synchronous DRAM after a power up operation, and a code input for setting operation modes, which is a mode register setup process through address pins, and the initialization process are carried out. After an external power is initially applied, if the refresh signal ref is activated in a logic high level before internal nodes of the latch circuit is completely initialized, the address input buffer is disabled. Therefore, since the code input for setting the operation modes is not performed, an erroneous operation is caused.

However, if the refresh signal ref is abnormally activated in a logic high level in the initialization process as a 'D' case in Table 1, the power down signal pwdn and the bank active signal bank_act become a logic low level, so that the bias control signal bias_ctrl is activated in a logic high level. Therefore, the erroneous operation can be prevented.

In accordance with another embodiment of the present invention, the controlling unit 20 can be designed with a different logic from the logic illustrated in FIG. 2. Therefore, if necessary, the power down signal pwdn may be not used.

Also, even if the current mirroring unit is provided toward the power supply voltage VDD and the bias transistor M21 is provided toward the ground voltage VSS in a NMOS type in accordance with the preferred embodiment of the present invention, the current mirroring unit can be provided toward the ground voltage VSS and the bias transistor M21 can be provided toward the power supply voltage in a PMOS type.

As mentioned above, the erroneous operation can be prevented and unnecessary current consumption generated from the address input buffer can be minimized in accordance with the present invention.

While the present invention has been described with respect to the particular embodiments, it will be apparent to those skilled in the art that various changes and modifications may be made without departing from the spirit and scope of the invention as defined in the following claims.

What is claimed is:

1. An address input buffer in a semiconductor memory device, comprising:
   a differential amplifying means for differentially amplifying a reference voltage and an external address signal; and
   a controlling means generating a bias control signal by receiving a refresh signal and a bank active signal to control the differential amplifying means,
   wherein activation of the bias control signal depends on the bank active signal when the refresh signal is abnormally activated in an initialization process.

2. The address input buffer as recited in claim 1, wherein the controlling means further receives a power down signal.

3. The address input buffer as recited in claim 2, wherein the controlling means includes:
   a NAND gate receiving the refresh signal and the bank active signal;
   an inverter receiving an output of the NAND gate; and
   a NOR gate receiving an output of the inverter and the power down signal to output the bias control signal.

4. An address buffer in a semiconductor memory device, comprising:
   a differential input unit receiving a reference voltage and an address signal;
   a current mirroring unit connected between the differential input unit and a first voltage;
   a biasing unit, which is connected between the differential input unit and a second voltage, for supplying bias current to the differential input unit and the current mirroring unit; and
   a controlling unit for generating a bias control signal by receiving a refresh signal and a bank active signal to enable/disable the biasing unit, wherein the bias control signal is activated if the refresh signal is abnormally activated in an initialization process.

5. The address input buffer as recited in claim 4, wherein the controlling unit further receives a power down signal.

6. The address input buffer as recited in claim 5, wherein the controlling unit includes:

a NAND gate receiving the refresh signal and the bank active signal;

an inverter receiving an output of the NAND gate; and a NOR gate receiving an output of the inverter and the power down signal to output the bias control signal.

7. The address input buffer as recited in claim 6, wherein the differential input unit, the current mirroring unit and the biasing unit constitutes a differential amplification circuit of a PMOS type.

8. The address input buffer as recited in claim 5, wherein the controlling unit includes:

a NAND gate receiving the refresh signal and the bank active signal;

a first inverter receiving an output of the NAND gate;

a NOR gate receiving an output of the first inverter and the power down signal; and a second inverter receiving an output of the NOR gate to output the bias control signal.

9. The address input buffer as recited in claim 8, wherein the differential input unit, the current mirroring unit and the biasing unit constitutes a differential amplification circuit of an NMOS type.

10. The address input buffer as recited in claim 5, further comprising a CMOS inverter connected to an output node provided in the differential input unit.

11. The address input buffer as recited in claim 5, further comprising a precharge unit for precharging the output node in response to an output signal of the controlling unit.

* * * * *